United States Patent
Abura et al.

(10) Patent No.: US 11,137,683 B2
(45) Date of Patent: Oct. 5, 2021

(54) PHOTOSENSITIVE RESIN COMPOSITION AND PHOTOSENSITIVE RESIN PRINTING PLATE PRECURSOR CONTAINING THE SAME

(71) Applicant: TORAY INDUSTRIES, INC., Tokyo (JP)

(72) Inventors: Tsutomu Abura, Okazaki (JP); Norihito Tachi, Okazaki (JP); Kohei Ideta, Okazaki (JP); Ryosuke Takahashi, Okazaki (JP)

(73) Assignee: TORAY INDUSTRIES, INC., Tokyo (JP)

( * ) Notice: Subject to any disclaimer, the term of this patent is extended or adjusted under 35 U.S.C. 154(b) by 262 days.

(21) Appl. No.: 16/470,042

(22) PCT Filed: Dec. 20, 2017

(86) PCT No.: PCT/JP2017/045753
§ 371 (c)(1),
(2) Date: Jun. 14, 2019

(87) PCT Pub. No.: WO2018/123773
PCT Pub. Date: Jul. 5, 2018

(65) Prior Publication Data
US 2020/0103753 A1 Apr. 2, 2020

(30) Foreign Application Priority Data

Dec. 26, 2016 (JP) .............................. JP2016-250962
Mar. 23, 2017 (JP) .............................. JP2017-056935
Jun. 20, 2017 (JP) .............................. JP2017-120103

(51) Int. Cl.
*G03F 7/037* (2006.01)
*C08K 3/22* (2006.01)
*C08K 3/36* (2006.01)
*C08L 77/00* (2006.01)
*G03F 7/004* (2006.01)

(52) U.S. Cl.
CPC ................ *G03F 7/037* (2013.01); *C08K 3/22* (2013.01); *C08K 3/36* (2013.01); *C08L 77/00* (2013.01); *G03F 7/0043* (2013.01); *C08K 2003/2227* (2013.01); *C08K 2201/003* (2013.01); *C08K 2201/006* (2013.01)

(58) Field of Classification Search
CPC ...................................................... G03F 7/037
See application file for complete search history.

(56) References Cited

U.S. PATENT DOCUMENTS

| | | | | |
|---|---|---|---|---|
| 4,548,894 A * | 10/1985 | Lynch | ..................... | G03F 7/115 430/270.1 |
| 4,994,348 A * | 2/1991 | Raabe | ..................... | G03F 7/027 430/287.1 |
| 2017/0243737 A1* | 8/2017 | Tanigaki | ........... | H01L 21/31116 |
| 2017/0285477 A1* | 10/2017 | Tanigaki | ............... | G03F 7/0047 |

FOREIGN PATENT DOCUMENTS

| | | |
|---|---|---|
| JP | 58-18635 A | 2/1983 |
| JP | 58-145613 A | 8/1983 |
| JP | 2-6957 A | 1/1990 |
| JP | 2001-199719 A | 7/2001 |
| JP | 2005206436 A * | 8/2005 |
| JP | 2016-79061 A | 5/2016 |
| JP | 2017026930 A * | 2/2017 |

OTHER PUBLICATIONS

Machine Translation of JP-2017026930-A (Year: 2021).*
International Search Report, issued in PCT/JP2017/045753, PCT/ISA/210, dated Mar. 27, 2018.
Written Opinion of the International Searching Authority, issued in PCT/JP2017/045753, PCT/ISA237, dated Mar. 27, 2018.

* cited by examiner

*Primary Examiner* — Chanceity N Robinson
(74) *Attorney, Agent, or Firm* — Birch, Stewart, Kolasch & Birch, LLP

(57) ABSTRACT

A photosensitive resin composition and a photosensitive resin printing plate precursor which allow development that uses a solution containing a lower alcohol and which are excellent in abrasion resistance and excellent in the ink wiping characteristics of a plate surface exhibited when the plate surface is squeegeed with a blade of a pad printer are provided. The photosensitive resin composition is characterized by containing (A) an inorganic fine particle whose average particle diameter is greater than or equal to 0.5 μm and less than or equal to 4 μm and whose sphericity is greater than or equal to 0.9, (B) a polyamide having in its molecular main chain an aliphatic ring and/or a skeleton represented by general formula (1), (C) a compound having an ethylenic double bond, and (D) a photopolymerization initiating agent.

12 Claims, No Drawings

PHOTOSENSITIVE RESIN COMPOSITION AND PHOTOSENSITIVE RESIN PRINTING PLATE PRECURSOR CONTAINING THE SAME

TECHNICAL FIELD

The invention relates to a photosensitive resin composition and a photosensitive resin printing plate precursor which allow development that uses a solution containing a lower alcohol and which are excellent in abrasion resistance and excellent in the ink wiping characteristics of a plate surface exhibited when the plate surface is squeegeed with a blade of a pad printer.

BACKGROUND ART

A photosensitive resin printing plate precursor that uses a photosensitive resin laminate having a layer that is formed from a photosensitive resin composition generally contains in a photosensitive resin layer a soluble polymer, a photopolymerizable unsaturated group-containing monomer, and a photopolymerization initiating agent as essential components. The photosensitive resin layer is irradiated with ultraviolet light through a negative/positive original film to form in the photosensitive resin layer portions that dissolve in a solvent and portions that do not dissolve in the solvent, whereby a relief image is formed. Thus, the photosensitive resin printing plate precursor is used as a printing plate.

The pad printing that uses an intaglio printing plate is a kind of offset printing that carries out printing by laying ink on a printing surface and wiping it off with a doctor blade made of metal or placing ink into an ink cup that has a ring-shaped edge made of ceramics or made of a special metal and wiping the printing surface with the ink cup so as to fill the depressions of the intaglio printing plate with ink, and transferring the ink to a surface of a soft pad of silicone rubber or the like, and then bringing the ink-loaded surface of the pad into pressure contact with a printing medium. As for the intaglio printing plates used for pad printing, the printing surface is required to have an abrasion resistance because in this printing method, ink on the printing surface is wiped off by a doctor blade or an ink cup. As for photosensitive resin compositions for use printing which are required to have such abrasion resistance, photosensitive resin compositions compounded with inorganic fine particles that are abrasive particles as illustrated in Patent Document 1 or 2 have been proposed.

PRIOR ART DOCUMENTS

Patent Documents

Patent Document 1: Japanese Unexamined Patent Publication (Kokai) No. HEI 2-6957
Patent Document 2: Japanese Unexamined Patent Publication (Kokai) No. SHO 58-18635
Patent Document 3: Japanese Unexamined Patent Publication (Kokai) No. SHO 58-145613
Patent Document 4: Japanese Unexamined Patent Publication (Kokai) No. 2001-199719
Patent Document 5: Japanese Unexamined Patent Publication (Kokai) No. 2016-79061

SUMMARY OF THE INVENTION

Problems to be Solved by the Invention

By the way, in the case where an inorganic fine particle is compounded into a photosensitive resin composition, when the inorganic fine particle used is irregularly shaped, it sometimes happens that influence of the inorganic fine particle increases the surface roughness of the intaglio printing plate, so that the wiping of the ink on the printing surface with a doctor blade or an ink cup becomes insufficient.

The invention has been made in view of the foregoing circumstances. An object of the invention is to provide a photosensitive resin composition and a photosensitive resin printing plate precursor which allow development that uses a solution containing a lower alcohol and which allow formation of high-definition relief images and which are excellent in abrasion resistance and excellent in the ink wiping characteristics of a plate surface exhibited when the plate surface is squeegeed with a blade of a pad printer.

Means for Solving the Problems

A resin composition for use for an intaglio printing plate precursor or a pad printing plate precursor according to a first invention which solves the foregoing problems is characterized by containing (A) an inorganic fine particle whose average particle diameter is greater than or equal to 0.5 μm and less than or equal to 4 μm and whose sphericity is greater than or equal to 0.9.

A photosensitive resin composition according to a second invention is characterized by containing (A) an inorganic fine particle whose average particle diameter is greater than or equal to 0.5 μm and less than or equal to 4 μm and whose sphericity is greater than or equal to 0.9, (B) a polyamide having in a molecular main chain an aliphatic ring and/or having a skeleton represented by a general formula (1), (C) a compound having an ethylenic double bond, and (D) a photopolymerization initiating agent.

[CHEM. 1]

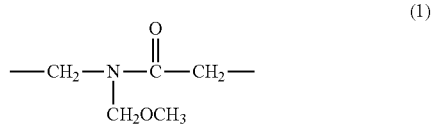

(1)

Advantageous Effects of the Invention

According to the first invention, a resin composition for use for an intaglio printing plate precursor or a pad printing plate precursor which allows development that uses a solution containing a lower alcohol and which allows formation of a high-definition relief image and which is excellent in abrasion resistance and excellent in the ink wiping characteristics of a plate surface exhibited when the plate surface is squeegeed with a blade of a pad printer, and a resin printing plate precursor can be provided.

According to the second invention, a photosensitive resin composition and a photosensitive resin printing plate precursor which allow development that uses a solution containing a lower alcohol and which allow formation of a high-definition relief image and which are excellent in abrasion resistance and excellent in the ink wiping characteristics of a plate surface exhibited when the plate surface is squeegeed with a blade of a pad printer can be provided.

DESCRIPTION OF PREFERRED EMBODIMENTS

Preferred embodiments of the invention will be hereinafter described.

The resin composition for use for an intaglio printing plate precursor or a pad printing plate precursor of the first invention contains as an (A) component an inorganic fine particle whose average particle diameter is greater than or equal to 0.5 μm and less than or equal to 4 μm and whose sphericity is greater than or equal to 0.9 (hereinafter, referred to as "inorganic fine particle (A)"). By using the inorganic fine particle (A) as described above, a resin composition for use for an intaglio printing plate precursor or a pad printing plate precursor which is excellent in abrasion resistance and excellent in the ink wiping characteristics of a plate surface exhibited when the plate surface is squeegeed with a blade of a pad printer can be provided.

The inorganic fine particle (A), because its average particle diameter being greater than or equal to 0.5 μm, can certainly provide an abrasion resistance exhibited at the time of blading by a pad printer and, because of its average particle diameter being less than or equal to 4 μm, can certainly provide ink wiping characteristics of the plate surface exhibited when the plate surface is squeegeed with the blade of the pad printer. It is appropriate that the average particle diameter of the inorganic fine particle (A) be preferably greater than or equal to 0.8 μm and more preferably greater than or equal to 1.0 μm. Furthermore, it is appropriate that the average particle diameter be preferably less than or equal to 4.0 μm and more preferably less than or equal to 3.0 μm. Still further, as the sphericity of the inorganic fine particle (A) is greater than or equal to 0.9 and is preferably greater than or equal to 0.90 and more preferably 0.90 to 1.0, the surface roughness of the printing plate becomes small, so that even better ink wiping characteristics can be achieved. Incidentally, in the invention, the average particle diameter of the inorganic fine particle (A) is a median diameter measured by a laser diffraction scattering method. Furthermore, as for the sphericity, 50 inorganic fine particles (A) were observed for shape by using a scanning type electron microscope, the ratio of shortest axis/longest axis of each of the particles was determined, and its arithmetic mean value of the 50 particles was determined as the sphericity.

As the inorganic fine particle (A) described above, fine particles of a metal alone, inorganic oxide particles, inorganic salt fine particles, fine particles made up of an organic component and an inorganic component, etc. can be cited. Among these, a silica particle whose refractive indexes with respect to (B) the polyamide, (C) the compound having an ethylenic double bond, and (D) the photopolymerization initiating agent, which are organic components contained in the resin composition, are comparatively close is preferable from the viewpoint of reduction of scatter of ultraviolet light when the resin composition used in an intaglio printing plate precursor or a pad printing plate precursor is irradiated with light and therefore photo-cured. Furthermore, from the viewpoint of safe handling, amorphous silica is more preferable. On the other hand, in order to improve the abrasion resistance of the printing surface when the printing surface is wiped with a doctor blade or an ink cup, alumina having a greater Vickers hardness than silica particle can be used, and use of mixture of silica particle and alumina is also possible.

As for the production method for amorphous silica and alumina whose sphericity is greater than or equal to 0.9, although the production method is not particularly limited, methods in which silica particle or alumina particle is fused in flame as illustrated in Patent Documents 3 and 4, methods in which silicon powder or metal aluminum is burned for the production by a VMC (vaporized metal combustion) method as illustrated in Patent Document 5, etc. are known.

Furthermore, as for the inorganic fine particle (A) of the invention, it is preferable that the specific surface area be 10 $m^2/g$ or less. When the specific surface area of the inorganic fine particle (A) is 10 $m^2/g$ or less, a resin solution made by dissolving in a solvent the resin composition for use for an intaglio printing plate precursor or a pad printing plate precursor is good in fluidity, facilitating formation of a smooth film surface. It is appropriate that the specific surface area of the inorganic fine particle (A) be more preferably 9 $m^2/g$ or less and even more preferably 8 $m^2/g$ or less. In this description, the specific surface area of the inorganic fine particle (A) can be measured on the basis of a method described in JIS Z8830:2013.

On the other hand, the maximum particle diameter of the inorganic fine particle (A) is preferably 20 μm or less and more preferably 20.0 μm or less. When its maximum particle diameter is 20 μm or less, the ink remaining after the squeegeeing with a blade of a pad printer will be reduced. The maximum particle diameter of the inorganic fine particle (A) is more preferably 10 μm or less. Incidentally, the maximum particle diameter was set by passing inorganic fine particles through a sieve having a corresponding size.

Furthermore, as for the inorganic fine particle (A), it is preferable that the pH of extraction water be within the range of 5.5 to 8.5. The pH of extraction water within this range will inhibit the aggregation of the inorganic fine particle (A) caused by the electrostatic attraction with other components used in the invention. It is more preferable that the pH of extraction water be within the range of 6.0 to 8.0. Furthermore, even if, in a resin composition solution for use at the time of preparation of the resin composition for use for an intaglio printing plate precursor or a pad printing plate precursor of the first invention, the inorganic fine particle (A) precipitates and aggregates during storage, it can be easily redispersed by stirring or the like because the electrostatic attraction is small. Thus, the inorganic fine particle (A) is excellent in handling characteristic. The pH of the extraction water of the inorganic fine particle (A) is determined by mixing a powder of the inorganic fine particle (A) in distilled water in an amount of 10 mass % relative to the distilled water and then measuring, with a pH meter, the pH of supernatant liquid obtained after 30 minutes of stirring. Incidentally, the pH of the inorganic fine particle can be adjusted by causing an activity inhibiting agent to act on active hydroxyl groups that the inorganic fine particle has. As examples of the activity inhibiting agent, it is appropriate that one or more species selected from organic phosphine compounds, sulfide compounds, mercaptan compounds, ketone compounds, and amide compounds be used, which is not restrictive. Incidentally, these activity inhibiting agents can be used by mixing them with the inorganic fine particle (A) and heating at a temperature of 90 to 180° C. for 4 to 24 hours.

If the inorganic fine particle (A) as described above is used, the inorganic fine particle (A), when compounded arbitrarily with (B) the polyamide and (C) the compound having an ethylenic double bond, is inhibited from aggregating and re-aggregating, so that ink on the plate surface can be favorably wiped off by a blade of a pad printer.

Incidentally, it is preferable that the inorganic fine particle (A) be contained in an amount of 3 mass % or greater in 100 mass % of the resin composition for use for an intaglio printing plate precursor or a pad printing plate precursor, in order to provide abrasion resistance. In order to allow formation of a layer, it is preferable that the content thereof be 70 mass % or less. As for the content of the inorganic fine particle (A), more preferably, it is appropriate that it be 8 mass % or greater and it is appropriate that it be 60 mass % or less.

It is also possible to introduce an ethylenic double bond into a surface of the inorganic fine particle (A) by using a surface modifying agent. As such a modifying agent, for example, (3-acroylpropyl)trimethoxysilane, methacroylpropyltrimethoxysilane, methacroylpropyltriethoxysilane, methacroyloxymethyltriethoxysilane, methacroyloxymethyltrimethoxysilane, etc. can be cited, but the agent is not limited to these. Surface-modifying the inorganic fine particle (A) with an ethylenic double bond makes possible the reaction with (C) a compound having an ethylenic double bond, so that the close contact between the inorganic fine particle (A) and a resin part becomes good and the abrasion resistance improves.

The resin composition for use for an intaglio printing plate precursor or a pad printing plate precursor of the first invention can further contain at least one selected arbitrarily from the group consisting of (B) the polyamide, (C) the compound having an ethylenic double bond, and (D) the photopolymerization initiating agent, for the foregoing inorganic fine particle (A).

The resin composition for use for an intaglio printing plate precursor or a pad printing plate precursor can arbitrarily contain (B) the polyamide (hereinafter, referred to as "polyamide (B)"). It is appropriate that the polyamide (B) contain a polyamide having in its molecular main chain an aliphatic ring and/or a polyamide having a skeleton represented by the general formula (1). Furthermore, it is appropriate that the polyamide (B) contain a polyamide having a methylene chain whose carbon number is 8 or greater. Furthermore, the polyamide (B) can combine a plurality of polyamides selected from a polyamide having in its molecular main chain an aliphatic ring, a polyamide having a skeleton represent by the general formula (1), a polyamide having a methylene chain whose carbon number is 8 or greater.

The polyamide (B) has a function as a support resin for making the resin composition for use for an intaglio printing plate precursor or a pad printing plate precursor into a solid state and thereby maintaining a configuration. Furthermore, the polyamide (B) is used to provide a resin layer made of the resin composition of the first invention with developability by a solution that contains a lower alcohol.

Because the polyamide (B) is insoluble in water, a printing plate obtained from a resin composition for use for an intaglio printing plate precursor or a pad printing plate precursor which contains the polyamide (B) is not subject to the influence of water even when the printing plate is used under an environment with high humidity, and has good abrasion resistance.

It is preferable that the number-average molecular weight of the polyamide (B) be 10,000 to 1,000,000. The polyamide (B) with a number-average molecular weight greater than or equal to 10,000 can have a function as a support resin for making the resin composition for use for an intaglio printing plate precursor or a pad printing plate precursor into a solid state and thereby maintaining a configuration. The polyamide (B) with a number-average molecular weight less than or equal to 1,000,000 makes it possible that when the resin layer made of the resin composition of the first invention is selectively cured by exposure to ultraviolet light, as is done for an image, so as to remove the uncured regions in the development, the uncured regions can be quickly removed by a developing solution that contains a lower alcohol. Incidentally, the lower alcohol refers to an alcohol whose carbon number in its molecule is 5 or less. It is appropriate that the number-average molecular weight of the polyamide (B) be more preferably 20,000 or greater and even more preferably 30,000 or greater and be more preferably 600,000 or less and even more preferably 200,000 or less. In this description, the number-average molecular weight of the polyamide (B) can be a number-average molecular weight in terms of polystyrene measured by gel permeation chromatography (GPC).

It is preferable that, in 100 mass % of the resin composition for use for an intaglio printing plate precursor or a pad printing plate precursor, the content of the polyamide (B) be 20 to 80 mass %. Containing the polyamide (B) in an amount of 20 mass % or greater makes it possible for the polyamide (B) to make the composition into a solid state and thereby maintain a configuration. Furthermore, containing the polyamide (B) in an amount of 80 mass % or less makes it easy to form a relief image. It is appropriate that the content of the polyamide (B) be preferably 20 mass % or greater and more preferably 30 mass % or greater. Furthermore, it is appropriate that the content of the polyamide (B) be preferably 80 mass % or less and more preferably 70 mass % or less.

In the polyamide (B), the polyamide having in its molecular main chain an aliphatic ring can be obtained by carrying out the polymerization of the polyamide through condensation polymerization of a diamine and/or a dicarboxylic acid having an aliphatic ring and its derivative. As the aliphatic ring, alicyclic compounds, such as cyclopropane, cyclobutane, cyclopentane, cyclohexane, cycloheptane, and cyclooctane can be cited. The polyamide (B) has in its molecular main chain a bivalent residue of one of such alicyclic compounds. Among these, a residue of cyclohexane is preferable, for example, a polyamide (B) having a 4,4'-diaminodicyclohexylmethane adipate skeleton residue is preferable.

As the polyamide described above, for example, a polycondensate that contains 4,4'-diaminodicyclohexylmethane adipate salt is known. Furthermore, a copolycondensate of 4,4'-diaminodicyclohexylmethane adipate salt ands-caprolactam, hexamethylene diammonium adipate salt as illustrated in Patent Document 1 is known.

As for the monomer component that contains such an aliphatic ring, it is preferable that its amount be 10 to 100 mol % relative to 100 mol % of the total polyamide components, that is, the sum total of an amino carboxylic acid unit (including the case of lactam as a raw material), a dicarboxylic acid unit, and a diamine unit, and it is more preferable that its amount be 10 to 80 mol %. If the content of the monomer component that contains an aliphatic ring is greater than or equal to 10 mol %, the solubility to the lower alcohol when a resin layer made of the resin composition for use for an intaglio printing plate precursor or a pad printing plate precursor improves. As a result, it becomes possible that when the resin layer made of the resin composition of the first invention is selectively cured by exposure to ultraviolet light, as is done for an image, so as to remove the uncured regions in the development, the uncured regions can be quickly removed by a developing solution that contains a lower alcohol. If the content of the monomer components is less than or equal to 80 mol %, the chemical resistance as a crystalline polymer is favorably maintained.

Furthermore, the polyamide (B) can have a skeleton represented by the following general formula (1), with or without an aliphatic ring in the molecular main chain.

[CHEM. 2]

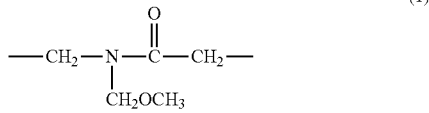

(1)

The polyamide (B) having a skeleton represented by the general formula (1) can be obtained by reacting amide-bonded hydrogens of the polyamide with formaldehyde and methanol and thereby N-methoxymethylating the amide bonds.

It is preferable that 10 to 50 mol % of the amide-bonded hydrogen in the molecule be methoxymethylated. Setting the methoxymethylation to 10 mol % or greater increases the solubility based on the lower alcohol, so that when the resin layer made of the resin composition of the first invention is selectively cured by exposure to ultraviolet light, as is done for an image, so as to remove the uncured regions in the development, the uncured regions can be quickly removed by a developing solution that contains a lower alcohol. Furthermore, setting the methoxymethylation to 50 mol % or less makes it possible to maintain the abrasion resistance of the polymer. It is appropriate that the methoxymethylation of amide-bonded hydrogen be more preferably 10 mol % or greater and even more preferably 20 mol % or greater. Furthermore, it is appropriate that the methoxymethylation be more preferably 80 mol % or less and even more preferably 70 mol % or less. Incidentally, the methoxymethylation rate of amide-bonding hydrogen can be controlled by the amounts of formamide and methanol added and the temperature of reaction and the time of reaction thereof.

As such a polyamide, for example, "Toresin" (registered trademark) MF-30 (made by Nagase ChemteX Corporation) having a number-average molecular weight of 40,000 with 30 mol % of the amide bonds of 6-nylon modified into a skeleton represented by the general formula (1) can be cited.

Furthermore, as the polyamide (B), a mixture of a polyamide having in its molecular main chain an aliphatic ring and a polyamide having a skeleton represented by the general formula (1) can also be used.

Furthermore, the polyamide (B) can contain a polyamide that has a methylene chain whose carbon number is 8 or greater. For example, it is also possible to use a so-called copolymer nylon made by copolymerization of, for example, nylon 6 or nylon 66 with monomers each having a methylene chain whose carbon number is 8 or greater, such as nylon 610, nylon 11, or nylon 12. Containing a monomer having a methylene chain whose carbon number is 8 or greater in an amount of 15 to 60 weight % in terms of the weight ratio of the monomers in the polyamide makes the polyamide (B) soluble in the lower alcohol. Furthermore, the methylene chain's having a carbon number of 8 or greater makes the polyamide (B) soluble in the lower alcohol and is therefore preferable and having a carbon number of 12 or less is economically advantageous and therefore preferable. As such polyamides having a methylene chain whose carbon number is 8 or greater, for example, "Amilan" (registered trademark) CM8000 (made by Toray Industries, Inc.) made by copolymerization of nylons 6/66/610/12 can be cited.

Furthermore, it is also possible to use as the polyamide (B) a mixture of a polyamide having a methylene chain whose carbon number is 8 or greater with a polyamide having in its molecular main chain an aliphatic ring described above and/or a polyamide having a skeleton represented by general formula (1).

The resin composition for use for an intaglio printing plate precursor or a pad printing plate precursor of the first invention can arbitrarily contain (C) an ethylenic double bond-containing compound. As concrete examples of (C) the ethylenic double bond-containing compound preferably usable, those as follows can be cited but the ethylenic double bond-containing compound is not limited thereto. Incidentally, it is appropriate that (C) the ethylenic double bond-containing compound contain in its molecule a hydroxyl group.

For example, compounds having only one ethylenic double bond, such as benzyl (meth)acrylate, cyclohexyl (meth)acrylate, tetrahydrofurfuryl (meth)acrylate, 2-(meth)acryloyloxyethyl hexahydrophthalic acid, phenoxy diethylene glycol (meth)acrylate, 2-(meth)acryloyloxyethylphthalic acid, neopentyl glycol-(meth)acrylic acid-benzoic acid ester, (meth)acryloyl morpholine, styrene and its derivatives, vinyl pyridine, N-vinyl-2-pyrrolidone, (meth)acryloyloxyethyl hydrogen phthalate, N-phenyl maleimide and its derivatives, N-(meth)acryl oxysuccinimide, (meth)acrylic acid-2-naphthyl, N-phenyl (meth) acrylamide, divinylethylene urea, divinylpropylene urea, vinyl caprolactam, vinylcarbazole, bicyclopentenyl (meth)acrylate, 1-vinylimidazole, 2-methyl-1-vinylimidazole, (2-methyl-ethyldioxolane-4-yl)methyl acrylate, imide acrylate, (2-oxy-1,3-dioxolane-4-yl)methyl (meth)acrylate, 2-(oxydiimidazolidine-1-yl)ethyl (meth)acrylate, 2,2,6,6-tetramethyl-4-piperidyl acrylate, methyl (meth)acrylate, ethyl (meth)acrylate, propyl (meth)acrylate, butyl (meth)acrylate, isoamyl (meth)acrylate, 2-ethylhexyl (meth)acrylate, lauryl (meth)acrylate, stearyl (meth)acrylate, chloroethyl (meth)acrylate, chloropropyl (meth)acrylate, methoxyethyl (meth)acrylate, ethoxyethyl (meth)acrylate, butoxyethyl (meth)acrylate, ethoxy diethylene glycol (meth)acrylate, methoxy triethylene glycol (meth)acrylate, methoxy dipropylene glycol (meth)acrylate, (meth)acrylamide, diacetone (meth) acrylamide, N,N'-methylene bis(meth)acrylamide, 2,2-dimethylaminoethyl (meth)acrylate, 2,2-diethyl aminoethyl (meth) acrylate, N,N-dimethylaminoethyl(meth)acrylamide, N,N-dimethyl aminopropyl(meth)acrylamide, and 2-hydroxyethyl (meth)acrylate, compounds having two or more ethylenic double bonds, such as multi(meth)acrylates obtained by addition reaction of a compound having an ethylenic double bond and an active hydrogen, such as unsaturated carboxylic acids and unsaturated alcohols, to di(meth)acrylate of polyethylene glycol, such as diethylene glycol di (meth)acrylate, trimethylol propane tri(meth)acrylate, pentaerythritol tri(meth)acrylate, pentaerythritol tetra (meth)acrylate, glycerol tri(meth)acrylate, or ethylene glycol diglycidyl ether, multi(meth)acrylates obtained by addition reaction of an unsaturated epoxy compound, such as glycidyl (meth)acrylate, to a compound having an active hydrogen, such as carboxylic acids and amines, multi(meth) acrylamides, such as methylene bis(meth)acrylamide, multivinyl compounds, such as divinyl benzene, among others can be cited.

Among these (C) ethylenic double bond-containing compounds, those having one or more hydroxyl groups are good in the compatibility with the polyamide (B) and also good in the dispersibility of the inorganic fine particle (A) of which the pH of the extraction water is in the range of 5.5 to 8.5, and allows manufacture of a uniform composition when compounded in the resin composition for use for an intaglio printing plate precursor or a pad printing plate precursor. As (C) the ethylenic double bond-containing compounds as described above, 2-hydroxy-3-phenoxypropyl (meth)acrylate, [4-(hydroxymethyl)cyclohexyl]methyl (meth)acrylate, 2-hydroxyethyl (meth)acrylate, 2-hydroxypropyl (meth)acrylate, 2-hydroxybutyl (meth)acrylate, 3-chloro-2-hydroxypropyl (meth)acrylate, β-hydroxy-β'-(meth)acryloyloxyethyl phthalate, 3-chloro-2-hydroxypropyl (meth)acrylate, glycerol di(meth)acrylate, etc. can be cited.

Furthermore, (C) the ethylenic double bond-containing compound having two or more hydroxyl groups, due to the hydrogen bonds of hydroxyl groups, are able to inhibit the swelling of an intaglio printing plate caused by an organic solvent of ink for use in pad printing. As such compounds, glycerin mono(meth)acrylate and pentaerythritol mono(meth)acrylate can be cited. However, the compounds are not limited to these examples.

It is preferable that the content of these (C) ethylenic double bond-containing compounds be 5 to 70 mass % relative to 100 mass % of the photosensitive resin composition. When the content is 5 mass % or greater, the composition can be used in printing with ink, without swelling of the printing plate. When the content is 70 mass % or less, formation of the resin composition for use for an intaglio printing plate precursor or a pad printing plate precursor becomes easy. Therefore, the range of the content is preferable. It is appropriate that (C) the ethylenic double bond-containing compound be contained in an amount of more preferably 10 mass parts or greater and even more preferably 20 mass parts or greater relative to 100 mass parts of the polyamide (B). Furthermore, it is appropriate that the content of (C) the ethylenic double bond-containing compound be more preferably 200 mass parts or less and even more preferably 100 mass parts or less.

As for (C) the ethylenic double bond-containing compound, the case where the compound contains both an acryloyl group and a methacryloyl group is preferable. It is preferable that the number of methacryloyl groups is larger than the number of acryloyl groups in (C) the ethylenic double bond-containing compound. Generally, the methacryloyl group is lower in reaction rate than the acryloyl group. Therefore, in the case of irradiation with ultraviolet radiation through a positive film, the great number of methacryloyl groups results in deep depressions of relief. Therefore, screen cells formed by placing a dot screen film of 300 lines and 90%, or the like, in close contact and delivering ultraviolet radiation facilitate the depth adjustment of the depressions.

Furthermore, the resin composition for use for an intaglio printing plate precursor or a pad printing plate precursor of the first invention can arbitrarily contain (D) the photopolymerization initiating agent. As (D) the photopolymerization initiating agent, any photopolymerization initiating agent can be used as long as it is able to cause polymerizable carbon-carbon unsaturated groups to be optically polymerized. In particular, a photopolymerization initiating agent having a function of producing radicals due to self-decomposition or hydrogen abstraction is preferably used. As (D) the photopolymerization initiating agent, there exist, for example, benzoin alkyl ethers, benzophenones, anthraquinones, benzyls, acetophenones, and diacetyls.

As for the amount of (D) the photopolymerization initiating agent compounded, an amount in the range of 0.1 to 15 mass % relative to 100 mass % of the photosensitive resin composition is preferable. If the amount of (D) the photopolymerization initiating agent compounded is 0.1 mass % or greater, the relief image formability improves. If the amount thereof is 15 mass % or less, it becomes possible to inhibit deposition of the photopolymerization initiating agent. It is appropriate that the amount of (D) the photopolymerization initiating agent compounded be more preferably 0.5 mass % or greater and even more preferably 1 mass % or greater. Furthermore, it is appropriate that the amount of (D) the photopolymerization initiating agent compounded be more preferably 12 mass % or less and even more preferably 10 mass % or less.

As for the resin composition for use for an intaglio printing plate precursor or a pad printing plate precursor of the first invention, it is possible to add, as a compatibility assistant agent for enhancing compatibility and flexibility, polyhydric alcohols such as ethylene glycol, diethylene glycol, triethylene glycol, glycerin and its derivatives, trimethylol propane and its derivatives, trimethylol ethane and its derivatives, and pentaerythritol and its derivatives. It is preferable that these polyhydric alcohols be added in an amount of 30 mass % or less relative to the entire resin composition for use for an intaglio printing plate precursor or a pad printing plate precursor. Particularly, the improved compatibility will reduce turbidity of the resin composition and the bleedout of low-molecular weight components.

Furthermore, in an intaglio printing plate formed from a resin printing plate precursor that uses the resin composition for use for an intaglio printing plate precursor or a pad printing plate precursor of the first invention, in order to form depressions good in shape, an ultraviolet radiation absorbing agent may be compounded for the purpose of reducing scatter of light in a resin layer for use in the intaglio printing plate precursor or the pad printing plate precursor. As preferable ultraviolet absorbing agents, benzotriazole based, triazine based, and benzophenone based compounds can be cited. One or more species of these can be used. Incidentally, as for the amount of the ultraviolet radiation absorbing agent compounded, it is preferable to use it in an amount in the range of 0.001 to 5 mass % relative to the total resin composition.

Furthermore, in order to enhance the thermal stability of the resin composition for use for an intaglio printing plate precursor or a pad printing plate precursor of the first invention, a conventionally known polymerization inhibitor agent can be added. As preferable polymerization inhibitor agents, phenols, hydroquinones, catechols, N-nitrosamine derivatives, etc. can be cited. As for the amount of these agents compounded, it is preferable to use them in an amount in the range of 0.001 to 5 mass parts relative 100 mass parts of the total resin composition.

Furthermore, in the resin composition for use for an intaglio printing plate precursor or a pad printing plate precursor of the first invention, a dye, a pigment, a surfactant, an antifoaming agent, a flavor, etc. can be added as other components.

The photosensitive resin composition of the second invention contains (A) an inorganic fine particle whose average particle diameter is greater than or equal to 0.5 µm and less than or equal to 4 µm and whose sphericity is greater than or equal to 0.9, (B) a polyamide having in its molecular main chain an aliphatic ring and/or having a specific skeleton, (C) a compound having an ethylenic double bond, and (D) a photopolymerization initiating agent. Furthermore, the photosensitive resin composition can also contain (A) an inorganic fine particle whose average particle diameter is greater than or equal to 0.5 µm and less than or equal to 4 µm and whose sphericity is greater than or equal to 0.9, (B) a polyamide having a methylene chain whose carbon number is 8 or greater, (C) a compound having an ethylenic double bond, and (D) a photopolymerization initiating agent. Still further, the foregoing polyamide can contain a polyamide having in its molecular main chain an aliphatic ring, and/or polyamide having a specific skeleton, and/or a polyamide having a methylene chain whose carbon number is 8 or greater.

The photosensitive resin composition of the second invention contains as the (A) component an inorganic fine particle whose average particle diameter greater than or equal to 0.5 µm and less than or equal to 4 µm and whose sphericity is greater than or equal to 0.9 (hereinafter, referred to as "inorganic fine particle (A)"). Use of the inorganic fine particle (A) described above makes it possible to provide a photosensitive resin composition excellent in abrasion resistance and excellent in the ink wiping characteristics of the plate surface exhibited when the plate surface is squeegeed with a blade of a pad printer.

The inorganic fine particle (A), because of its average particle diameter being greater than or equal to 0.5 µm, can certainly provide an abrasion resistance exhibited at the time of blading by a pad printer and, because of its average particle diameter being less than or equal to 4.0 µm, can certainly provide ink wiping characteristics of the plate surface exhibited when the plate surface is squeegeed with the blade of the pad printer. It is appropriate that the average particle diameter of the inorganic fine particle (A) be preferably greater than or equal to 0.8 µm and more preferably greater than or equal to 1.0 µm. Furthermore, it is appropriate that the average particle diameter be preferably less than or equal to 4.0 µm and more preferably less than or equal to 3.0 µm. Still further, as the sphericity of the inorganic fine particle (A) is greater than or equal to 0.9 and is preferably greater than or equal to 0.90 and more preferably 0.90 to 1.0, the surface roughness of the printing plate becomes small, so that even better ink wiping characteristics can be achieved. Incidentally, in the invention, the average particle diameter of the inorganic fine particle (A) is a median diameter measured by a laser diffraction scattering method. Furthermore, as for the sphericity, 50 inorganic fine particles (A) were observed for shape by using a scanning type electron microscope, the ratio of shortest axis/longest axis of each of the particles was determined, and its arithmetic mean value of the 50 particles was determined as the sphericity.

As the inorganic fine particle (A) described above, fine particles of a metal alone, inorganic oxide particles, inorganic salt fine particles, fine particles made up of an organic component and an inorganic component, etc. can be cited. Among these, a silica particle whose refractive indexes with respect to (B) the polyamide, (C) the compound having an ethylenic double bond, and (D) the photopolymerization initiating agent, which are organic components contained in the resin composition, are comparatively close is preferable from the viewpoint of reduction of scatter of ultraviolet light when the photosensitive resin composition is irradiated with light and therefore photo-cured. Furthermore, from the viewpoint of safe handling, amorphous silica is more preferable. On the other hand, in order to improve the abrasion resistance of the printing surface when the printing surface is wiped with a doctor blade or an ink cup, alumina having a greater Vickers hardness than silica particle can be used, and use of mixture of silica particle and alumina is also possible.

As for the production method for amorphous silica and alumina whose sphericity is greater than or equal to 0.9, although the production method is not particularly limited, methods in which silica particle or alumina particle is fused in flame as illustrated in Patent Documents 3 and 4, methods in which silicon powder or metal aluminum is burned for the production by a VMC (vaporized metal combustion) method as illustrated in Patent Document 5, etc. are known.

Furthermore, as for the inorganic fine particle (A) of the invention, it is preferable that the specific surface area be 10 $m^2/g$ or less. When the specific surface area of the inorganic fine particle (A) is 10 $m^2/g$ or less, a resin solution made by dissolving in a solvent the photosensitive resin composition is good in fluidity, facilitating formation of a smooth film surface. It is appropriate that the specific surface area of the inorganic fine particle (A) be more preferably 9 $m^2/g$ or less and even more preferably 8 $m^2/g$ or less. In this description, the specific surface area of the inorganic fine particle (A) can be measured on the basis of a method described in JIS Z8830:2013.

On the other hand, the maximum particle diameter of the inorganic fine particle (A) is preferably 20 µm or less and more preferably 20.0 µm or less. When its maximum particle diameter is 20 µm or less, the ink remaining after the squeegeeing with a blade of a pad printer will be reduced. The maximum particle diameter of the inorganic fine particle (A) is more preferably 10 µm or less. Incidentally, the maximum particle diameter was set by passing inorganic fine particles through a sieve having a corresponding size.

Furthermore, as for the inorganic fine particle (A), it is preferable that the pH of extraction water be within the range of 5.5 to 8.5. The pH of extraction water within this range will inhibit the aggregation of the inorganic fine particle (A) caused by the electrostatic attraction with other components used in the invention. Furthermore, even if, in the photosensitive resin composition solution for use at the time of preparation of the photosensitive resin composition of the second invention, the inorganic fine particle (A) precipitates and aggregates during storage, it can be easily redispersed by stirring or the like because the electrostatic attraction is small. Thus, the inorganic fine particle (A) is excellent in handling characteristic. The pH of the extraction water of the inorganic fine particle (A) is determined by mixing a powder of the inorganic fine particle in distilled water in an amount of 10 mass % relative to the distilled water and then measuring, with a pH meter, the pH of supernatant liquid obtained after 30 minutes of stirring. Incidentally, the pH of the inorganic fine particle can be adjusted by causing an activity inhibiting agent to act on active hydroxyl groups that the inorganic fine particle has. As examples of the activity inhibiting agent, it is appropriate that one or more species selected from organic phosphine compounds, sulfide compounds, mercaptan compounds, ketone compounds, and amide compounds be used, which is not restrictive. Incidentally, these activity inhibiting agents can be used by mixing them with the inorganic fine particle (A) and heating at a temperature of 90 to 180° C. for 4 to 24 hours.

If the inorganic fine particle (A) as described above is used, the inorganic fine particle (A), when compounded with (B) the polyamide having in its molecular main chain an aliphatic ring and/or having a skeleton represented by the general formula (1) and (C) the compound having an ethylenic double bond, is inhibited from aggregating and re-aggregating, so that ink on the plate surface can be favorably wiped off by a blade of a pad printer.

Incidentally, it is preferable that the inorganic fine particle (A) be contained in an amount of 3 mass % or greater in 100 mass % of the photosensitive resin composition, in order to provide abrasion resistance. In order to allow formation of a layer, it is preferable that the content thereof be 70 mass % or less. As for the content of the inorganic fine particle (A), more preferably, it is appropriate that it be 8 mass % or greater and it is appropriate that it be 60 mass % or less.

It is also possible to introduce an ethylenic double bond into a surface of the inorganic fine particle (A) by using a surface modifying agent. As such a modifying agent, for example, (3-acroylpropyl)trimethoxysilane, methacroylpropyltrimethoxysilane, methacroylpropyltriethoxysilane, methacroyloxymethyltriethoxysilane, methacroyloxymethyltrimethoxysilane, etc. can be cited, but the agent is not limited to these. Surface-modifying the inorganic fine particle (A) makes it possible to make the dispersibility good and inhibit aggregation and re-aggregation when the inorganic particle (A) is mixed with (B) the polyamide having in its molecular main chain an aliphatic ring and/or having a skeleton represented by the general formula (1) and (C) the compound having an ethylenic double bond.

The photosensitive resin composition of the second invention contains (B) the polyamide having in its molecular main chain an aliphatic ring and/or the polyamide having a skeleton represented by the general formula (1) (hereinafter, referred to as "polyamide (B)"). The polyamide (B) has a function as a support resin for making the photosensitive resin composition into a solid state and therefore maintaining a configuration. Furthermore, the polyamide (B) is used to provide the photosensitive resin layer with developability by a solution that contains a lower alcohol.

Because the polyamide (B) is insoluble in water, a printing plate obtained from a photosensitive resin composition that contains the polyamide (B) is not subject to the influence of water even when the printing plate is used under an environment with high humidity, and has good abrasion resistance.

It is preferable that the number-average molecular weight of the polyamide (B) be 10,000 to 1,000,000. The polyamide (B) with a number-average molecular weight greater than or equal to 10,000 can have a function as a support resin for making the photosensitive resin composition into a solid state and thereby maintaining a configuration. The polyamide (B) with a number-average molecular weight less than or equal to 1,000,000 makes it possible that when the photosensitive resin layer is selectively cured by exposure to ultraviolet light, as is done for an image, so as to remove the uncured regions in the development, the uncured regions can be quickly removed by a developing solution that contains a lower alcohol. Incidentally, the lower alcohol refers to an alcohol whose carbon number in its molecule is 5 or less. It is appropriate that the number-average molecular weight of the polyamide (B) be more preferably 20,000 or greater and even more preferably 30,000 or greater and be more preferably 600,000 or less and even more preferably 200,000 or less. In this description, the number-average molecular weight of the polyamide (B) can be a number-average molecular weight in terms of polystyrene measured by gel permeation chromatography (GPC).

It is preferable that, in 100 mass % of the photosensitive resin composition, the content of the polyamide (B) be 20 to 80 mass %. Containing the polyamide (B) in an amount of 20 mass % or greater makes it possible for the polyamide (B) to make the composition into a solid state and thereby maintain a configuration. Furthermore, containing the polyamide (B) in an amount of 80 mass % or less makes it easy to form a relief image. The content of the polyamide (B) is preferably 20 mass % or greater and more preferably 30 mass % or greater. Furthermore, the content of the polyamide (B) is preferably 80 mass % or less and more preferably 70 mass % or less.

In the polyamide (B), the polyamide having in its molecular main chain an aliphatic ring can be obtained by carrying out the polymerization of the polyamide through condensation polymerization of a diamine and/or a dicarboxylic acid having an aliphatic ring and its derivative. As the aliphatic ring, alicyclic compounds, such as cyclopropane, cyclobutane, cyclopentane, cyclohexane, cycloheptane, and cyclooctane can be cited. The polyamide (B) has in its molecular main chain a bivalent residue of one of such alicyclic compounds. Among these, a residue of cyclohexane is preferable, for example, a polyamide (B) having a 4,4'-diaminodicyclohexylmethane adipate skeleton residue is preferable.

As the polyamide described above, for example, a polycondensate that contains 4,4'-diaminodicyclohexylmethane adipate salt is known. Furthermore, a copolycondensate of 4,4'-diaminodicyclohexylmethane adipate salt ands-caprolactam, hexamethylene diammonium adipate salt as illustrated in Patent Document 1 is known.

As for the monomer component that contains such an aliphatic ring, it is preferable that its amount be 10 to 100 mol % relative to 100 mol % of the total polyamide components, that is, the sum total of an amino carboxylic acid unit (including the case of lactam as a raw material), a dicarboxylic acid unit, and a diamine unit, and it is more preferable that its amount be 10 to 80 mol %. If the content of the monomer component that contains an aliphatic ring is greater than or equal to 10 mol %, the solubility to the lower alcohol when the photosensitive resin composition is made into a photosensitive resin layer improves. As a result, it becomes possible that when the photosensitive resin layer is selectively cured by exposure to ultraviolet light, as is done for an image, so as to remove the uncured regions in the development, the uncured regions can be quickly removed by a developing solution that contains a lower alcohol. If the content of the monomer components is less than or equal to 80 mol %, the chemical resistance as a crystalline polymer is favorably maintained.

Furthermore, the polyamide (B) has a skeleton represented by the following general formula (1), with or without an aliphatic ring in the molecular main chain.

[CHEM. 3]

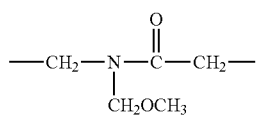

(1)

The polyamide (B) having a skeleton represented by the general formula (1) can be obtained by reacting amide-bonded hydrogens of the polyamide with formaldehyde and methanol and thereby N-methoxymethylating the amide bonds.

It is preferable that 10 to 50 mol % of the amide-bonded hydrogen in the molecule be methoxymethylated. Setting the methoxymethylation to 10 mol % or greater increases the solubility based on the lower alcohol, so that when the photosensitive resin layer is selectively cured by exposure to ultraviolet light, as is done for an image, so as to remove the uncured regions in the development, the uncured regions can be quickly removed by a developing solution that contains a lower alcohol. Furthermore, setting the methoxymethylation to 50 mol % or less makes it possible to maintain the abrasion resistance of the polymer. It is appropriate that the methoxymethylation of amide-bonded hydrogen be more preferably 10 mol % or greater and even more preferably 20 mol % or greater. Furthermore, it is appropriate that the methoxymethylation be more preferably 80 mol % or less and even more preferably 70 mol % or less.

As such a polyamide, for example, "Toresin" (registered trademark) MF-30 (made by Nagase ChemteX Corporation) having a number-average molecular weight of 40,000 with 30 mol % of the amide bonds of 6-nylon modified into a skeleton represented by the general formula (1) can be cited.

Furthermore, as the polyamide (B), a mixture of a polyamide having in its molecular main chain an aliphatic ring and a polyamide having a skeleton represented by the general formula (1) can also be used.

Furthermore, as the polyamide (B), a polyamide that has a methylene chain whose carbon number is 8 or greater can be contained. For example, it is also possible to use a so-called copolymer nylon made by copolymerization of, for example, nylon 6 or nylon 66 with monomers each having a methylene chain whose carbon number is 8 or greater, such as nylon 610, nylon 11, or nylon 12. Containing a monomer having a methylene chain whose carbon number is 8 or greater in an amount of 15 to 60 weight % in terms of the weight ratio of the monomers in the polyamide makes the polyamide (B) soluble in the lower alcohol. Furthermore, the methylene chain's having a carbon number of 8 or greater makes the polyamide (B) soluble in the lower alcohol and is therefore preferable and having a carbon number of 12 or less is economically advantageous and therefore preferable. As such polyamides having a methylene chain whose carbon number is 8 or greater, for example, "Amilan" (registered trademark) CM8000 (made by Toray Industries, Inc.) made by copolymerization of nylons 6/66/610/12 can be cited.

Furthermore, it is also possible to use as the polyamide (B) a mixture of a polyamide having a methylene chain whose carbon number is 8 or greater with a polyamide having in its molecular main chain an aliphatic ring and/or a polyamide having a skeleton represented by general formula (1).

The photosensitive resin composition of the second invention can contains (C) an ethylenic double bond-containing compound.

As concrete examples of (C) the ethylenic double bond-containing compound preferably usable, those as follows can be cited but the ethylenic double bond-containing compound is not limited thereto. Incidentally, it is appropriate that (C) the ethylenic double bond-containing compound contain in its molecule a hydroxyl group.

For example, compounds having only one ethylenic double bond, such as benzyl (meth)acrylate, cyclohexyl (meth)acrylate, tetrahydrofurfuryl (meth)acrylate, 2-(meth) acryloyloxyethyl hexahydrophthalic acid, phenoxy diethylene glycol (meth)acrylate, 2-(meth)acryloyloxyethylphthalic acid, neopentyl glycol-(meth)acrylic acid-benzoic acid ester, (meth)acryloyl morpholine, styrene and its derivatives, vinyl pyridine, N-vinyl-2-pyrrolidone, β-(meth) acryloyloxyethyl hydrogen phthalate, N-phenyl maleimide and its derivatives, N-(meth)acryl oxysuccinimide, (meth) acrylic acid-2-naphthyl, N-phenyl(meth)acrylamide, divinylethylene urea, divinylpropylene urea, vinyl caprolactam, vinylcarbazole, bicyclopentenyl (meth)acrylate, 1-vinylimidazole, 2-methyl-1-vinylimidazole, (2-methyl-ethyldioxolane-4-yl)methyl acrylate, imide acrylate, (2-oxy-1,3-dioxolane-4-yl)methyl (meth)acrylate, 2-(oxydiimidazolidine-1-yl)ethyl (meth)acrylate, 2,2,6,6-tetramethyl-4-piperidyl acrylate, methyl (meth)acrylate, ethyl (meth)acrylate, propyl (meth)acrylate, butyl (meth)acrylate, isoamyl (meth)acrylate, 2-ethylhexyl (meth)acrylate, lauryl (meth)acrylate, stearyl (meth)acrylate, chloroethyl (meth)acrylate, chloropropyl (meth)acrylate, methoxyethyl (meth)acrylate, ethoxyethyl (meth)acrylate, butoxyethyl (meth)acrylate, ethoxy diethylene glycol (meth)acrylate, methoxy triethylene glycol (meth)acrylate, methoxy dipropylene glycol (meth)acrylate, (meth)acrylamide, diacetone (meth) acrylamide, N,N'-methylene bis(meth)acrylamide, 2,2-dimethylaminoethyl (meth)acrylate, 2,2-diethyl aminoethyl (meth) acrylate, N,N-dimethylaminoethyl(meth)acrylamide, N,N-dimethyl aminopropyl(meth)acrylamide, and 2-hydroxyethyl (meth)acrylate, compounds having two or more ethylenic double bonds, such as multi(meth)acrylates obtained by addition reaction of a compound having an ethylenic double bond and an active hydrogen, such as unsaturated carboxylic acids and unsaturated alcohols, to di(meth)acrylate of polyethylene glycol, such as diethylene glycol di(meth)acrylate, trimethylol propane tri(meth)acrylate, pentaerythritol tri(meth)acrylate, pentaerythritol tetra (meth)acrylate, glycerol tri(meth)acrylate, or ethylene glycol diglycidyl ether, multi(meth)acrylates obtained by addition reaction of an unsaturated epoxy compound, such as glycidyl (meth)acrylate, to a compound having an active hydrogen, such as carboxylic acids and amines, multi(meth) acrylamides, such as methylene bis(meth)acrylamide, multivinyl compounds, such as divinyl benzene, among others can be cited.

Among these (C) ethylenic double bond-containing compounds, those having one or more hydroxyl groups are good in the compatibility with the polyamide (B) and also good in the dispersibility of the inorganic fine particle (A) of which the pH of the extraction water is in the range of 5.5 to 8.5, and allows manufacture of a uniform composition when compounded in the photosensitive resin composition. As (C) the ethylenic double bond-containing compounds as described above, 2-hydroxy-3-phenoxypropyl (meth)acrylate, [4-(hydroxymethyl)cyclohexyl]methyl (meth)acrylate, 2-hydroxyethyl (meth)acrylate, 2-hydroxypropyl (meth) acrylate, 2-hydroxybutyl (meth)acrylate, 3-chloro-2-hydroxypropyl (meth)acrylate, β-hydroxy-β'-(meth)acryloyloxyethyl phthalate, 3-chloro-2-hydroxypropyl (meth) acrylate, glycerol di(meth)acrylate, etc. can be cited.

Furthermore, (C) the ethylenic double bond-containing compound having two or more hydroxyl groups, due to the hydrogen bonds of hydroxyl groups, are able to inhibit the swelling of an intaglio printing plate caused by an organic solvent of ink for use in pad printing. As such compounds, glycerin mono(meth)acrylate and pentaerythritol mono (meth)acrylate can be cited. However, the compounds are not limited to these examples.

It is preferable that the content of these (C) ethylenic double bond-containing compounds be 5 to 200 mass parts relative to 100 mass parts of the polyamide (B). When the content is 5 mass parts or greater, the composition can be used in printing with ink, without swelling of the printing plate. When the content is 200 mass parts or less, formation of the photosensitive resin composition becomes easy. Therefore, the range of the content is preferable. It is appropriate that (C) the ethylenic double bond-containing compound be contained in an amount of more preferably 10 mass parts or greater and even more preferably 20 mass parts or greater relative to 100 mass parts of the polyamide (B). Furthermore, it is appropriate that the content of (C) the ethylenic double bond-containing compound be more preferably 200 mass parts or less and even more preferably 100 mass parts or less.

As for (C) the ethylenic double bond-containing compound, the case where the compound contains both an acryloyl group and a methacryloyl group is preferable. It is preferable that the number of methacryloyl groups is larger than the number of acryloyl groups in (C) the ethylenic double bond-containing compound. Generally, the methacryloyl group is lower in reaction rate than the acryloyl group. Therefore, in the case of irradiation with ultraviolet radiation through a positive film, the great number of methacryloyl groups results in deep depressions of relief. Therefore, screen cells formed by placing a dot screen film of 300 lines and 90%, or the like, in close contact and delivering ultraviolet radiation facilitate the depth adjustment of the depressions.

Furthermore, the photosensitive resin composition of the second invention contains (D) the photopolymerization initiating agent. As (D) the photopolymerization initiating agent, any photopolymerization initiating agent can be used as long as it is able to cause polymerizable carbon-carbon unsaturated groups to be optically polymerized. In particular, a photopolymerization initiating agent having a function of producing radicals due to self-decomposition or hydrogen abstraction is preferably used. As (D) the photopolymerization initiating agent, there exist, for example, benzoin alkyl ethers, benzophenones, anthraquinones, benzyls, acetophenones, and diacetyls.

As for the amount of (D) the photopolymerization initiating agent compounded, an amount in the range of 0.1 to 20 mass parts relative to 100 mass parts of the polyamide (B) is preferable. If the amount of (D) the photopolymerization initiating agent compounded is 0.1 mass % or greater, the relief image formability improves. If the amount thereof is 20 mass parts or less, it becomes possible to inhibit deposition of the photopolymerization initiating agent. It is appropriate that the amount of (D) the photopolymerization initiating agent compounded be more preferably 0.5 mass part or greater and even more preferably 1 mass part or greater. Furthermore, it is appropriate that the amount of (D) the photopolymerization initiating agent compounded be more preferably 10 mass parts or less and even more preferably 8 mass parts or less.

As for the photosensitive resin composition of the second invention, it is possible to add, as a compatibility assistant agent for enhancing compatibility and flexibility, polyhydric alcohols such as ethylene glycol, diethylene glycol, triethylene glycol, glycerin and its derivatives, trimethylol propane and its derivatives, trimethylol ethane and its derivatives, and pentaerythritol and its derivatives. It is preferable that these polyhydric alcohols be added in an amount of 30 mass % or less relative to the entire photosensitive resin composition. Particularly, the improved compatibility will reduce turbidity of the resin composition and the bleedout of low-molecular weight components.

Furthermore, in an intaglio printing plate formed from a photosensitive resin printing plate precursor that uses the photosensitive resin composition of the second invention, in order to form depressions good in shape, an ultraviolet radiation absorbing agent may be compounded for the purpose of reducing scatter of light in a photosensitive resin layer. As preferable ultraviolet absorbing agents, benzotriazole based, triazine based, and benzophenone based compounds can be cited. One or more species of these can be used. Incidentally, as for the amount of the ultraviolet radiation absorbing agent compounded, it is preferable to use it in an amount in the range of 0.001 to 5 mass % relative to the total photosensitive resin composition.

Furthermore, in order to enhance the thermal stability of the photosensitive resin composition of the second invention, a conventionally known polymerization inhibitor agent can be added. As preferable polymerization inhibitor agents, phenols, hydroquinones, catechols, N-nitrosamine derivatives, etc. can be cited. As for the amount of these agents compounded, it is preferable to use them in an amount in the range of 0.001 to 5 mass parts relative 100 mass parts of the total photosensitive resin composition.

Furthermore, in the photosensitive resin composition of the second invention, a dye, a pigment, a surfactant, an antifoaming agent, a flavor, etc. can be added as other components.

Next, a photosensitive resin laminate will be described. In the following description, the resin composition for use for an intaglio printing plate precursor or pad printing plate precursor of the first invention and the photosensitive resin composition of the second invention will be sometimes collectively referred to as the photosensitive resin composition of the invention or simply as the photosensitive resin composition.

As for the photosensitive resin laminate made of the photosensitive resin composition of the invention, an adhesion layer (G), a photosensitive resin layer (F) formed by using the photosensitive resin composition of the invention, and a protection layer are stacked in that order at least on a supporter (E). Then, the photosensitive resin printing plate precursor of the invention is formed by using the photosensitive resin laminate. Specifically, the photosensitive resin printing plate precursor of the invention is made by sequentially stacking the adhesion layer (G), the photosensitive resin layer (F) made of a photosensitive resin composition formed by the photosensitive resin composition of the invention, and the protection layer at least on the supporter (E).

As the supporter (E), a plastic sheet of polyester or the like, synthetic rubber sheet of styrene-butadiene rubber or the like, or a metal plate of steel, stainless steel, aluminum, etc. can be used. However, in pad printing in particular, because ink is placed on the printing surface and is wiped off by a doctor blade made of metal or because ink is placed into an ink cup having ring-shaped edge made of ceramics or made of a special metal which serves as a doctor blade and the printing surface is wiped over by the ink cup, it is preferable to use a metal plate so that the supporter will not be deformed by the force exerted at the time of wiping.

The thickness of the supporter is not particularly limited; however, it is preferable that its thickness be in the range of 100 to 500 μm from the viewpoint of handling characteristics. The thickness greater than or equal to 100 μm will inhibit deformation of the supporter and the thickness less than or equal to 500 μm will improve the handling characteristic.

It is preferable that the supporter (E) have been subjected to an adhesion-facilitating treatment for the purpose of improving the adherability to the photosensitive resin layer (F). As methods for the adhesion-facilitating treatment, mechanical processes such as sand blast, physical processes such as corona discharge, chemical processes by coating or the like, among others can be indicated as examples; however, providing an adhesion layer (G) by coating is preferable from the viewpoint of adherability.

The adhesion layer (G) is not particularly restricted as long as the adhesion layer (G) improves the adherability of the supporter (E) and the photosensitive resin layer (F). The adhesion layer (G) preferably contains at least a portion of a constitutional unit contained in the photosensitive resin layer (F), so that the adherability further improves. As such a common constitutional unit, a macromolecular compound having solubility in a solution containing a lower alcohol can be indicated as an example. Furthermore, as a soluble macromolecular compound, a polyamide resin containing a unit of ε-caprolactam can be preferably cited.

The photosensitive resin layer (F) is formed from the photosensitive resin composition of the invention. From the viewpoint of providing a sufficient relief depth and improving the printability, it is preferable that the thickness of the photosensitive resin layer (F) be greater than or equal to 0.01 mm and it is more preferable that the thickness be greater than or equal to 0.02 mm. On the other hand, it is preferable that the thickness of the photosensitive resin layer (F) be less than or equal to 1 mm and it is more preferable that the thickness be less than or equal to 0.7 mm from the viewpoint of costs and resource saving.

It is preferable that the photosensitive resin printing plate precursor of the invention have on the photosensitive resin layer (F) a cover film (H) as a protection layer from the viewpoint of surface protection and prevention of attachment of extraneous matters or the like. The photosensitive resin layer (F) may be in direct contact with the cover film (H) or one layer or a plurality of layers may be provided between the photosensitive resin layer (F) and the cover film (H). As a layer between the photosensitive resin layer (F) and the cover film (H), for example, a detachment aiding layer (I) provided for the purpose of preventing adhesion of a photosensitive resin layer surface, etc. can be cited.

The material of the cover film (H) is not particularly limited. However, plastic sheets of polyester, polyethylene, etc. are preferably used. The thickness of the cover film (H) is not particularly limited. However, the thickness in the range of 10 to 150 μm is preferable from the viewpoint of handling characteristics and costs. Furthermore, the cover film surface may have a roughened surface for the purpose of improving the adherability of an original film.

Next, the photosensitive resin composition of the invention and a production method for a photosensitive resin printing plate precursor that uses the photosensitive resin composition will be described. For example, after the inorganic fine particle (A) and the polyamide (B) are dissolved in a mixed solvent that contains alcohol as a main component while being heated, (C) the ethylenic double bond-containing compound, (D) the photopolymerization initiating agent, and a plasticizer, other additives, etc. according to need are added and sufficiently mixed by stirring to obtain a photosensitive resin composition solution.

The photosensitive resin layer (F) made of the photosensitive resin composition can be obtained by casting the photosensitive resin composition solution obtained by the foregoing method onto the supporter (E), preferably, the supporter (E) that has an adhesion layer (G) and drying the photosensitive resin composition solution. After that, a cover film (H) that has arbitrarily been coated with a detachment aiding layer (I) is placed in close contact with the photosensitive resin layer (F), so that a photosensitive resin printing plate precursor can be obtained. Furthermore, a photosensitive resin printing plate precursor can be obtained also by manufacturing a photosensitive resin sheet by dry film formation and performing lamination such that the photosensitive resin sheet is sandwiched between the supporter (E) and the cover film (H). Still further, it is also possible to provide a photosensitive resin composition that does not contain the inorganic fine particle (A) between the adhesion layer (G) and the photosensitive resin layer (F).

In the case where the photosensitive resin printing plate precursor has a detachment aiding layer (I), the formation method for the detachment aiding layer (I) is not particularly limited; however, a method in which a solution in which a detachment aiding layer (I) component has been dissolved is applied onto the cover film (H) and the solvent is removed is particularly preferably performed. As the removal method for the solvent, for example, hot air drying, far-infrared radiation drying, natural drying, etc. can be cited. The solvent for dissolving the detachment aiding layer (I) component is not particularly limited. However, water, alcohol, or a mixture of water and alcohol is preferably used.

Next, a printing plate formed by using the photosensitive resin printing plate precursor of the invention will be described. The printing plate of the invention is obtained by optical exposure and development of the foregoing photosensitive resin printing plate precursor of the invention.

In the case where the photosensitive resin printing plate precursor includes a cover film (H), the cover film (H) is peeled off, a positive original film is placed in close contact with the photosensitive resin layer (F), and the photosensitive resin layer (F) is photo-cured by irradiation with ultraviolet radiation. The irradiation with ultraviolet radiation can be carried out usually by using a high pressure mercury lamp, a super high-pressure mercury lamp, a metal halide lamp, a xenon lamp, a carbon arc lamp, a chemical lamp, etc. that can deliver wavelengths of 300 to 400 nm.

Next, a dot screen film of 300 lines and 90% is placed in close contact and ultraviolet radiation is delivered so that screen cells are formed at depressions, whereby adjustment is performed so that the depths of the depressions are appropriate.

Next, the photosensitive resin printing plate precursor is dipped into a developing solution and a relief image is formed on the substrate by a brush type development apparatus that removes the uncured regions by brushing off. Furthermore, besides the brush type development apparatus, a spraying type development apparatus can also be used. As for the developing solution, a solution containing a lower alcohol or a solution that further contains a surfactant can be used.

Incidentally, it is preferable that the liquid temperature at the time of development be 15 to 40° C. After the relief image formation, the plate is dried at 50 to 70° C. for about 10 minutes and, according to need, is further subjected to an active light ray treatment in the atmosphere or in vacuum, whereby an intaglio printing plate can be obtained.

Incidentally, although the photosensitive resin composition of the invention is most suitable for the use for a photosensitive resin printing plate precursor for intaglio printing or for pad printing, it can also be used for planographic printing, for relief printing, and for stencil printing and as photoresists.

[Plate Suitably Usable when the Supporter is a Plastic Film]

Incidentally, an intaglio printing plate whose supporter is a plastic film is lighter in weight and easier to handle than an intaglio printing plate has its supporter made of metal. As a method for fixing an intaglio printing plate whose supporter is a plastic film as mentioned above to a pad printer, there exists a method in which a double-sided tape is stuck to the supporter of the intaglio printing plate and a side of the double-sided tape is fixed to the printing table of the pad printer. However, in comparison with when an intaglio printing plate whose supporter is made of metal, particularly, an iron plate, is fixed to the printing table by magnet, the foregoing method, due to the strong close contact with the supporter, requires a long time for attachment and detachment of the intaglio printing plate and is not easy to use from the viewpoint of re-sticking operation (replacing operation) (reworkability).

Furthermore, in pad printing, ink on the printing plate surface is wiped off with a blade. However, in the case where an intaglio printing plate whose supporter is a plastic film is used, it sometimes happens that the supporter deforms at the time of ink wiping by the blade and therefore good pad printing cannot be carried out.

Therefore, in pad printing, in the case where an intaglio printing plate whose supporter is a plastic film is used, it is preferable to use a member (a plate or a constituent) that is easy to replace (excellent in reworkability) and, in addition, that is provided to make deformation of the supporter less likely even at the time of ink wiping by the blade.

It is preferable that such a plate be one that has a sticky layer on at least one side of the substrate. It is preferable that the sticky layer be located at the outermost layer.

As the substrate, anyone of metal, plastic, wood, glass, ceramics, etc. can be adopted. As the metal, iron or aluminum is preferable. As the plastic, polyester or the like is preferable. Among these, iron can be easily fixed to the printing table and is particularly suitably used in the case where a magnet is used for the printing table of the pad printer.

It is preferable that the thickness of the substrate be greater than or equal to 200 µm and less than or equal to 1 cm. Due to the thickness greater than or equal to 200 µm, the substrate has a mechanical strength and makes it possible to favorably perform placing ink on the printing surface and wiping off ink with a doctor blade made of metal or placing ink into a ring-shaped ink cup that has an edge made of ceramics or made of a special metal that serves as a doctor blade and wiping ink on the printing surface with the ink cup. Specifically, the deformation of the supporter when ink is wiped off with a blade can be inhibited. Furthermore, as for the substrate, the thickness less than or equal to 1 cm is preferable from the viewpoint of the attachment to the printer and costs.

The sticky layer is a layer that has self-adhesion property. For example, a sticky layer described in Japanese Unexamined Patent Publication (Kokai) No. 2014-122285 or the like can be used although this does not limit the sticky layer.

It is preferable that the thickness of the sticky layer be 1 to 100 µm, and it is more preferable that the thickness thereof be 5 to 75 µm. Setting the thickness of the sticky layer to 1 µm or greater can secure a sufficient adhesion force with respect to the adherend. Setting the thickness to 100 µm or less facilitates processes performed when the sticky layer is formed.

Such a plate is firmly secured to the supporter of the intaglio printing plate via the adhesion layer of the plate. It is preferable that the sticking force with the supporter of the intaglio printing plate that is the adherend of the sticky layer be in the range of 0.015 N to 0.1 N/25 mm. Because of the sticking force greater than or equal to 0.015 N/25 mm, it is possible to favorably perform placing ink on the printing surface of the intaglio printing plate and wiping ink off with a doctor blade made of metal or placing ink into a ring-shaped ink cup that has an edge made of ceramics or made of a special metal and that serves as a doctor blade and wiping the printing surface with the ink cup. Specifically, the deformation of the supporter when ink is wiped off with a blade can be inhibited. Furthermore, it is preferable that the sticking force be less than or equal to 0.1 N/25 mm from the viewpoint of re-sticking operation (reworkability).

Next, as for the formation method for the sticky layer on the substrate, examples can be cited, including: as a first example, a method in which a component of the sticky layer is applied to the substrate can be cited; as a second example, a method in which a film with a sticky layer formed is prepared, an adhesive is applied to an opposite surface of the film to the surface on which the sticky layer is formed, and the film is stuck to the substrate via the adhesive; as a third example, a method in which a film having on a side surface thereof a sticky layer and on the other surface an adhesion layer able to adhere to the substrate is used and this film is stuck to the substrate via the adhesion layer; etc. However, the formation method for the sticky layer on the substrate is not limited to these methods.

Furthermore, it is preferable that the size of the plate described above is a size that allows the plate to be attached to the printing table of the printer.

Due to use of the plate described above, even when an intaglio printing plate whose supporter is plastic film is used, the plate is easy to replace (excellent in reworkability); in addition, the deformation of the supporter when ink is wiped off with a blade can be inhibited.

The plate described above is used at the time of producing a print by pad printing. It is preferable that a production method that uses the plate described above for a print by pad printing include the following steps in that order.

Step 1) The step of firmly securing the supporter of the intaglio printing plate to the plate via the adhesion layer of the plate to obtain a constituent.

Step 2) The step of mounting the constituent in a pad printer.

Due to the use of the foregoing method, even when an intaglio printing plate whose supporter is a plastic film is used, the plate is easy to replace (excellent in reworkability); in addition, the deformation of the supporter when ink is wiped with a blade can be inhibited. As a result, the printing characteristics of pad printing can be enhanced. Furthermore, in the invention, a constituent in which the supporter of an intaglio printing plate has been firmly secured to (integrated with) the plate via the adhesion layer of the plate may be used.

Specifically, the constituent is a constituent that has a resin layer having depressions, a supporter, a sticky layer, and a substrate in that order.

The foregoing constituent can be used at the time of producing a print by pad printing. It is preferable that the production method that uses the foregoing constituent for a print by pad printing include the step of mounting the constituent in the pad printer.

Due to the use of the constituent and the method described above, even when an intaglio printing plate whose supporter is a plastic film is used, the easy replacement (excellent reworkability) is achieved; in addition, the deformation of the supporter when ink is wiped with a blade can be inhibited. As a result, the printing characteristics of pad printing can be enhanced.

Incidentally, with regard to the plate, the constituent, and the method that use them, technologies described in the description of Japanese Patent Application No. 2017-120049 filed in Japan can be applied.

EXAMPLES

The invention will be described in detail hereinafter with reference to Examples. Materials used in Examples will be indicated below.

Polyamide (B)

Polyamide having in its molecular main chain an aliphatic ring:

A polyamide 1 (made by Toray Industries, Inc.) made by polycondensation of approximately equal amounts of s-caprolactam, hexamethylene diammonium adipate salt, and 4,4'-diaminodicyclohexylmethane adipate salt and having a number-average molecular weight of 85,000 was used.

Polyamide Having a Skeleton Represented by the General Formula (1):

"Toresin" (registered trademark) MF-30 (made by Nagase ChemteX Corporation) with 30 mol % of the amide bonds of 6-nylon having been modified into a skeleton represented by the general formula (1) and with a number-average molecular weight of 40,000 was used.

Polyamide Having a Methylene Chain Whose Carbon Number is 8 or Greater:

"Amilan" (registered trademark) CM8000 (made by Toray Industries, Inc.) made by copolymerizing nylons 6/66/610/12 was used.

Inorganic Fine Particle (A):

inorganic fine particle powders indicated in Table 1 were used. Of these, inorganic fine particles of numbers 1 to 7 are of amorphous silica. As for measurement of the average particle diameter, measurement was performed by using an LA-500 made by HORIBA, Ltd. and water as a dispersion medium and setting the refractive index to 1.1. The maximum particle diameter was set to 20.0 μm by passing the particle through a sieve of 20.0 μm mesh. The specific surface area was measured by using Tristar 3000 made by Shimadzu Corporation and by a BET method on the basis of a method described in JIS Z8830:2013. As for the sphericity, from an image of inorganic fine particles taken by VE8800 made by Keyence Corporation, the shortest axes and longest axes of 50 particles were measured to calculate the shortest axis/longest axis, and then an arithmetic mean of the 50 particles was determined.

The pH of the extraction water of the inorganic fine particle (A) was measured by mixing 50 g of powder of the inorganic fine particle into 500 g of distilled water, and then using D-71 LAB made by HORIBA, Ltd. in supernatant water obtained after stirring for 30 minutes.

(C) Ethylenic double bond-containing compound (mentioned as "(C) component" in Tables 2 and 3).

Compounds having an ethylenic double bond having one hydroxyl group

Glycerol dimethacrylate (LIGHTESTER G101P made by Kyoeisha Chemical Co., Ltd.)

2-hydroxypropyl methacrylate (LIGHTESTER HOP made by Kyoeisha Chemical Co., Ltd.) Compounds having an ethylenic double bond that has two hydroxyl groups glycerol monomethacrylate (Blemmer GLM made by NOF CORPORATION)

Compounds having an ethylenic double bond that does not have a hydroxyl group isobutyl methacrylate (LIGHTESTER IB made by Kyoeisha Chemical Co., Ltd.)

triethylene glycol dimethacrylate (LIGHTESTER 3EG made by Kyoeisha Chemical Co., Ltd.)

(D) Photopolymerization initiating agent (mentioned as "(D) component" in Tables 2 and 3)

2,2-dimethoxy-1,1-diphenylethane-1-one (IRGACURE 651 made by BASF company)

polymerization inhibitor agent: N-(ammonium oxy)-N-nitrosphenyl amine (Cupferron made by KANTO CHEMICAL CO., INC.)

ultraviolet radiation absorbing agent: 2,4-di-tert-butyl-6-(5-chloro-2H-1,2,3-benzotriazole-2-yl) phenol (TINUVIN326 made by BASF company)

<Manufacture of a Supporter (E1) Having an Adhesion Layer (G1)>

A solution made by mixing 90 mass parts of bisphenol A "jER" (registered trademark) 834 (made by Mitsubishi Chemical Corporation) in a solvent of 30 mass parts of dimethylformamide and 30 mass parts of xylene was added into a solution made by mixing 66 mass parts of "Vinytol" (registered trademark) #284 (made by Nagoya Oilchemical Co., Ltd.) and 2 mass parts of hexamethylenetetramine (made by KANTO CHEMICAL CO., INC.) in a solvent of 16 mass parts of dimethylformamide and 16 mass parts of xylene, so that a coating liquid 1 for the adhesion layer (G1) was obtained.

20 mass parts of "Amilan" (registered trademark) CM833 (made by Toray Industries, Inc.) and 10 mass parts of

TABLE 1

| | No. | Name | Average particle diameter μm | Maximum particle diameter μm | Specific surface area $m^2/g$ | Sphericity | pH |
|---|---|---|---|---|---|---|---|
| Inorganic fine particle (A) | 1 | SC-2500SQ (made by Admatechs Company Limited, spherical silica) | 0.5 | 20.0 | 6.0 | 0.95 | 6.7 |
| | 2 | FB-5DM (made by Denka Company Limited, spherical silica) | 3.0 | 20.0 | 4.3 | 0.90 | 7.3 |
| | 3 | FB-8SM (made by Denka Company Limited, spherical silica) | 3.0 | 30.0 | 4.5 | 0.90 | 7.5 |
| | 4 | 0.3 μm SQ-CO (made by Admatechs Company Limited, spherical silica) | 0.3 | 20.0 | 6.0 | 0.94 | 8.3 |
| | 5 | S0-C1 (made by Admatechs Company Limited, spherical silica) | 0.5 | 20.0 | 5.0 | 0.95 | 4.5 |
| | 6 | Powder made by surface-treating SC-2500SQ (made by Admatechs Company Limited, spherical silica) with 3-aminotritriethoxysilane (0.2 wt % in silica weight ratio) | 0.5 | 20.0 | 6.0 | 0.95 | 9.0 |
| | 7 | FE920G-SQ (made by Admatechs Company Limited, spherical silica) | 5.0 | 20.0 | 4.5 | 0.95 | 6.0 |
| | 8 | S6-5 (made by MARUTO Testing Machine Company, high-purity silica powder) | 3.0 | 20.0 | 4.5 | 0.75 | 7.0 |
| | 9 | AO-502 (made by Admatechs Company Limited, spherical alumina) | 0.5 | 20.0 | 7.5 | 0.90 | 5.7 |

"CJPARL" (made by Automotive & Industrial Systems Company) were mixed in a mixed solvent of 50 mass parts of ethanol, 10 mass parts of water, 10 mass parts of dimethylformamide, and 50 mass parts of benzyl alcohol at 70° C. for 2 hours and thus dissolved. After that, 5 mass parts of bisphenol A "jER" (registered trademark) 834 (made by Mitsubishi Chemical Corporation) and 0.3 mass part of dicyano diamide (made by KANTO CHEMICAL CO., INC.) were added at 25° C. to obtain a coating liquid 2 for the adhesion layer (G1).

A coating liquid 1 for the adhesion layer (G1) was applied via a bar coater onto an iron plate (made by NIPPON STEEL & SUMITOMO METAL CORPORATION) having a thickness of 250 μm which was the supporter (E1) so that the post-drying film thickness became 10 μm, and then heating was performed for 3 minutes in an oven at 180° C. to remove the solvent. Then, a coating liquid 2 for the adhesion layer (G1) was further applied to the iron plate via a bar coater so that the dry film thickness became 10 μm, and then heating was performed for 3 minutes in an oven at 160° C. Thus, the supporter (E1) having the adhesion layer (G1) was obtained.

<Manufacture of a Supporter (E2) Having an Adhesion Layer (G2)>

A mixture of 260 mass parts of "VYLON" (registered trademark) 31SS (a toluene solution of unsaturated polyester resin, made by TOYOBO CO., LTD.) and 2 mass parts of benzoin ethyl ether (made by Wako Pure Chemical Industries, Ltd.) was heated at 70° C. for 2 hours and then cooled to 30° C. 7 mass parts of ethylene glycol diglycidyl ether dimethacrylate was added and mixing was performed for 2 hours. Furthermore, 25 mass parts of "CORONATE" (trademark registration) 3015E (an ethyl acetate solution of multiisocyanate resin, made by Tosoh Corporation) and 14 mass parts of "3M™" (registered trademark) EC-1368 (an industrial adhesive, made by Sumitomo 3M Limited) were added to obtain a coating liquid 1 for the adhesion layer (G2).

35 mass parts of a polyamide 1 (made by Toray Industries, Inc.) was mixed in a mixed solvent of 70 mass parts of methanol and 10 mass parts of water at 70° C. for 2 hours and thus dissolved. After that, 2 mass parts of benzoin ethyl ether (made by Wako Pure Chemical Industries, Ltd.) and 25 mass parts of ethylene glycol diglycidyl ether dimethacrylate were added and mixed for 30 minutes. The mixture was cooled to room temperature to obtain a coating liquid 2 for the adhesion layer (G2).

The coating liquid 1 for the adhesion layer (G2) was applied via a bar coater to a 250 μm thick "Lumirror" (registered trademark) T60 (a polyester film, made by Toray Industries, Inc.) of in thickness, which was the supporter (E2), so that the post-drying film thickness became 10 μm, and then heating was performed for 3 minutes in an oven at 180° C. to remove the solvent. Then, the coating liquid 2 for the adhesion layer (G2) was further applied via a bar coater so that the dry film thickness became 10 μm, and then heating was performed for 3 minutes in an oven at 160° C. Thus, a supporter (E2) having the adhesion layer (G2) was obtained.

<Cover Film (H)>

A 100 μm thick "Lumirror" (registered trademark) S10 (a polyester film, made by Toray Industries, Inc.) was used as a cover film (H).

[Evaluation Methods]

Evaluations in Examples and Comparative Examples were performed by the following methods.

(1) Abrasion Resistance

The polyester film of the cover film (H) alone was peeled off from the 7 cm×14 cm photosensitive resin printing plate precursor (the outermost surface of the post-peel photosensitive resin printing plate precursor was the detachment aiding layer having a dry film thickness of 1 μm), and a positive film was brought into vacuum contact and exposed using a chemical lamp FL20SBL-360 20 watt (made by Mitsubishi Electric OSRAM Ltd.) under such a condition as to achieve a grayscale sensitivity of 13±1. Thus, the entire surface of the 7 cm×14 cm photosensitive resin layer was photo-cured. After that, development was performed for 1 minute in an ethanol aqueous solution (ethanol/water=80/20) at a liquid temperature of 25° C. by a brush type development apparatus. After 10-minute drying at 60° C., post-exposure was further performed using a chemical lamp FL20SBL-360 20 watt (Made by Mitsubishi Electric OSRAM Ltd.) under the same condition as the main exposure to obtain a printing plate for abrasion resistance evaluation.

The thus-obtained printing plate was mounted in hermetic 6-12 universal (made by TAMPOPRINT company) and was squeegeed 50 thousand times, using as an ink PAD-PLV-1 INK White (made by Navitas company), to measure abraded depths of the printing plate. In the case where the abraded depth is greater than or equal to 10 μm, the depressions that are filled with ink during printing are shallow so that printing problems occur. The abraded depth less than 10 μm is preferable, and the abraded depth within 8 μm is more preferable, and the abraded depth of 6 μm is even more preferable.

(2) Blade Ink Wiping Characteristics

The cover film (H) was peeled off from the 7 cm×14 cm photosensitive resin printing plate precursor, and a positive film was brought into vacuum contact and exposed using a chemical lamp FL20SBL-360 20 watt (Made by Mitsubishi Electric OSRAM Ltd.) under such a condition as to achieve a grayscale sensitivity of 13±1. Thus, the entire surface of the 7 cm×14 cm photosensitive resin layer was photo-cured. After that, development was performed for 1 minute in an ethanol aqueous solution (ethanol/water=80/20) at a liquid temperature of 25° C. by a brush type development apparatus. After 10-minute drying at 60° C., post-exposure was further performed using a chemical lamp FL20SBL-360 20 watt (Made by Mitsubishi Electric OSRAM Ltd.) under the same condition as the main exposure to obtain a printing plate for evaluation of ink wiping characteristics.

The thus-obtained printing plate was mounted in a hermetic 6-12 universal(made by TAMPOPRINT company) and was squeegeed once, using as an ink PAD-PLV-1 INK White (made by Navitas company), to measure the thickness of ink remaining on the surface of the printing plate at 10 points. An average value of the measurements was determined. The case where the remaining ink was 1 μm or greater over the entire surface of the squeegeed region was given C (no good) because of occurrence of a printing problem due to transfer of ink to a location other than the print image portion. The case where there occurred a location where the remaining ink was partly 1 μm or greater was given B (acceptable). The case where there were no locations where the remaining ink was 1 μm or greater was given A (good).

Example 1

<Preparation of a Composition Solution 1 for the Photosensitive Resin Composition 1>

The polyamide (B) indicated in the column of Example 1 in Table 2 was added into a 3-necked flask that was equipped with a stirring spatula and a cooling pipe, and then a mixed solvent of 90 mass parts of "Solmix" (registered trademark) H-11 (an alcohol mixture, made by Japan Alcohol Corporation) and 10 mass parts of water was mixed. The mixture, while being stirred, was heated at 80° C. for 2 hours to dissolve the polyamide (B). After the mixture was cooled to 40° C., the other components in the column of Example 1 in Table 2 were added. Stirring was performed for 30 minutes to obtain a composition solution 1 for the photosensitive resin composition 1.

<Production of a Photosensitive Resin Printing Plate Precursor 1>

The obtained composition solution 1 was cast onto the supporter (E1) having the adhesion layer (G1) and dried at 60° C. for 2.5 hours. At this time, adjustment was performed so that the print thickness (iron plate+photosensitive resin layer) after being dried was 0.5 mm. A mixed solvent of water/ethanol=10/90 (weight ratio) was applied to the photosensitive resin layer (F) obtained as described above and the cover film (H) was brought into pressure contact with the surface to obtain the photosensitive resin printing plate precursor 1. Using the obtained photosensitive resin printing plate precursor 1, characteristics of printing plates were evaluated by the foregoing methods. Results are indicated in Table 2.

Examples 2 to 17

Photosensitive resin sheets and photosensitive resin printing plate precursors were manufactured in substantially the same manner as in Example 1, except that the compositions of the photosensitive resin compositions were altered as in Examples 2 to 17 of Tables 2 and 3. Evaluation results are indicated in Tables 2 and 3.

Example 18

<Production of a Photosensitive Resin Printing Plate Precursor 18>

A composition solution 1 was prepared in the same method as in Example 1. The obtained composition solution 1 was cast onto the supporter (E2) having the adhesion layer (G2) and was dried at 60° C. for 2.5 hours. At this time, adjustment was performed so that the print thickness (iron plate+photosensitive resin layer) after being dried was 0.3 mm. A mixed solvent of water/ethanol=10/90 (weight ratio) was applied to the photosensitive resin layer (F) obtained as described above and the cover film (H) was brought into pressure contact with the surface to obtain the photosensitive resin printing plate precursor 18. Using the obtained photosensitive resin printing plate precursor 18, characteristics of printing plate were evaluated by the foregoing methods. Results are indicated in Table 3. Incidentally, the photosensitive resin printing plate precursor 18, by the method described below, was brought into close contact with the metal plate manufactured by the following method and mounted in the pad printer and evaluated.

<Manufacturing Method for Metal Plates>
substrate: a 300-μm thick Can Super (steel plate made by NIPPON STEEL & SUMITOMO METAL CORPORATION)
film having a sticky layer: GPH25F01J02/LS25A (made by PANAC CO., LTD.): a film having on a side surface a sticky layer and on the other surface an adhesion layer The substrate and the GPH25F01J02/LS25A were adhered via an adhesion layer of the GPH25F01J02/LS25A to manufacture a metal plate having a sticky layer on the substrate.

<Mounting Method for a Pad Printing Machine>

A metal plate was cut into 70×140 mm. The supporter-side surface of the polyester film of the photosensitive resin printing plate precursor 16 was brought into pressure contact with the sticky layer of the metal plate by a 3 kg roller, thus manufacturing the constituent 1.

The constituent 1 made up of the metal plate and the photosensitive resin printing plate precursor 18 obtained as described above was mounted on the printing table of a pad printer hermetic 6-12 universal (made by TAMPOPRINT company) and thus attached to the printer. After that, the constituent 1 is detached from the printing table. A constituent 2 was manufactured in the same method as the constituent 1. The amount of time until the constituent 2 was mounted on the printing table was measured to be 1 minute.

Furthermore, even though ink was wiped off by the blade, deformation of the supporter was not observed.

Example 19

A photosensitive resin printing plate precursor 18 was produced by the same method as in Example 18, and this was determined as being a photosensitive resin printing plate precursor 18. A double-sided tape PGD-75 (made by 3M) was stuck to the supporter side (surface) of the polyester film of the photosensitive resin printing plate precursor 18, and an intaglio printing plate was fixed to the printing table and thus amounted in the pad printer hermetic 6-12 universal (made by TAMPOPRINT company). After that, the intaglio printing plate was peeled off from the printing table. The amount of time until another intaglio printing plate (a photosensitive resin printing plate precursor 18 separately prepared) was mounted on the printing table by using a double-sided tape was measured to be 10 minutes. Thus, an amount of time was required.

Comparative Examples 1 to 3

Photosensitive resin sheets and photosensitive resin printing plate precursors were manufactured in substantially the same manner as in Example 1, except that the compositions of the photosensitive resin compositions are altered as indicated with Comparative Examples 1 to 3 in Table 3. Evaluation results are indicated in Table 3.

TABLE 2

|  |  |  | Example | | | | | |
|  |  |  | 1 | 2 | 3 | 4 | 5 | 6 |
| --- | --- | --- | --- | --- | --- | --- | --- | --- |
| Compounding/ mass parts | Inorganic fine particle (A) | Inorganic fine particle of No. 1 of Table 1 | 20 | | | | | |
| | | Inorganic fine particle of No. 2 of Table 1 | | 20 | | 10 | 30 | 50 |
| | | Inorganic fine particle of No. 3 of Table 1 | | | 20 | | | |
| | Polyamide | Polyamide having in its Polyamide 1 | 80 | 80 | 80 | 80 | 80 | 80 |

TABLE 2-continued

|  |  |  |  |  |  |  |  |  |
|---|---|---|---|---|---|---|---|---|
| (B) | molecular main chain an aliphatic ring | | | | | | | |
| | Polyamide having a skeleton represented by general formula (1) | Toresin MF-30 | | | | | | |
| | Polyamide having a methylene chain whose carbon number is 8 or greater | CM8000 | | | | | | |
| (C) Component | Compound having an ethylenic double bond that has one hydroxyl group | Glycerol dimethacrylate | 20 | 20 | 20 | 20 | 20 | 20 |
| | | 2-hydroxypropyl methacrylate | 60 | 60 | 60 | 60 | 60 | 60 |
| | Compound having an ethylenic double bond that has two hydroxyl groups | Glycerol monomethacrylate | | | | | | |
| | Compound having an ethylenic double bond that does not contain a hydroxyl group | Isobutyl methacrylate | | | | | | |
| | | Triethylene glucol dimethacrylate | | | | | | |
| (D) Component | Photopolymerization initiating agent | 2,2-dimethoxy-1,1-diphenylethane-1-one | 3 | 3 | 3 | 3 | 3 | 3 |
| Polymerization inhibitor agent | | N-(ammoniumoxy)-N-nitros phenyl amine | 0.01 | 0.01 | 0.01 | 0.01 | 0.01 | 0.01 |
| Ultraviolet radiation absorbing agent | | 2,4-di-tert-butyl-6-(5-chloro-2H-1,2,3-benzotriazole-2-yl)phenol | 0.01 | 0.01 | 0.01 | 0.01 | 0.01 | 0.01 |
| | Supporter | | E1 | E1 | E1 | E1 | E1 | E1 |
| Evaluation results | | Abrasion depth/μm | 9 | 6 | 6 | 9 | 5 | 4 |
| | | Blade ink wiping characteristics | A | A | B | A | A | A |

| | | | Example | | | | | |
|---|---|---|---|---|---|---|---|---|
| | | | 7 | 8 | 9 | 10 | 11 | 12 |
| Compounding/ mass parts | Inorganic fine particle (A) | Inorganic fine particle of No. 1 of Table 1 | 20 | 20 | | | | |
| | | Inorganic fine particle of No. 2 of Table 1 | | | 20 | 20 | 20 | 20 |
| | | Inorganic fine particle of No. 3 of Table 1 | | | | | | |
| | Polyamide (B) | Polyamide having in its molecular main chain an aliphatic ring | Polyamide 1 | 80 | 80 | | 40 | | 40 |
| | | Polyamide having a skeleton represented by general formula (1) | Toresin MF-30 | | | 80 | 40 | | |
| | | Polyamide having a methylene chain whose carbon number is 8 or greater | CM8000 | | | | | 80 | 40 |
| | (C) Component | Compound having an ethylenic double bond that has one hydroxyl group | Glycerol dimethacrylate | 20 | | 20 | 20 | 20 | 20 |
| | | | 2-hydroxypropyl methacrylate | | | 60 | 60 | 60 | 60 |
| | | Compound having an ethylenic double bond that has two hydroxyl groups | Glycerol monomethacrylate | 60 | | | | | |
| | | Compound having an ethylenic double bond that does not contain a hydroxyl group | Isobutyl methacrylate | | 20 | | | | |
| | | | Triethylene glucol dimethacrylate | | 60 | | | | |
| | (D) Component | Photopolymerization initiating agent | 2,2-dimethoxy-1,1-diphenylethane-1-one | 3 | 3 | 3 | 3 | 3 | 3 |
| | Polymerization inhibitor agent | | N-(ammoniumoxy)-N-nitros phenyl amine | 0.01 | 0.01 | 0.01 | 0.01 | 0.01 | 0.01 |
| | Ultraviolet radiation absorbing agent | | 2,4-di-tert-butyl-6-(5-chloro-2H-1,2,3-benzotriazole-2-yl)phenol | 0.01 | 0.01 | 0.01 | 0.01 | 0.01 | 0.01 |
| | | Supporter | | E1 | E1 | E1 | E1 | E1 | E1 |
| | Evaluation results | | Abrasion depth/μm | 9 | 8 | 8 | 8 | 9 | 8 |
| | | | Blade ink wiping characteristics | A | B | A | A | A | A |

TABLE 3

| | | | Example 13 | Example 14 | Example 15 | Example 16 | Example 17 |
|---|---|---|---|---|---|---|---|
| Compounding/ mass parts | Inorganic fine particle (A) | Inorganic fine particle of No. 1 of Table 1 | | | | 10 | 15 |
| | | Inorganic fine particle of No. 4 of Table 1 | | | | | |
| | | Inorganic fine particle of No. 5 of Table 1 | 20 | | | | |
| | | Inorganic fine particle of No. 6 of Table 1 | | 20 | | | |
| | | Inorganic fine particle of No. 7 of Table 1 | | | | | |
| | | Inorganic fine particle of No. 8 of Table 1 | | | | | |
| | | Inorganic fine particle of No. 9 of Table 1 | | | 20 | 10 | 5 |
| | Polyamide (B) | Polyamide having in its molecular main chain an aliphatic ring | Polyamide 1 | 80 | 80 | 80 | 80 | 80 |
| | (C) Component | Compound having an ethylenic double bond that has one hydroxyl group | Glycerol dimethacrylate | 20 | 20 | 20 | 20 | 20 |
| | | | 2-hydroxypropyl methacrylate | 60 | 60 | 60 | 60 | 60 |
| | (D) Component | Photopolymerization initiating agent | 2,2-dimethoxy-1,1-diphenylethane-1-one | 3 | 3 | 3 | 3 | 3 |
| | Polymerization inhibitor agent | | N-(ammoniumoxy)-N-nitrosphenyl amine | 0.01 | 0.01 | 0.01 | 0.01 | 0.01 |
| | Ultraviolet radiation absorbing agent | | 2,4-di-tert-butyl-6-(5-chloro-2H-1,2,3-benzotriazole-2-yl) phenol | 0.01 | 0.01 | 0.01 | 0.01 | 0.01 |
| | Supporter | | | E1 | E1 | E1 | E1 | E1 |
| | Evaluation results | | Abrasion depth/μm | 6 | 6 | 1 | 2 | 3 |
| | | | Blade ink wiping characteristics | B | B | A | A | A |

| | | | Example 18 | Example 19 | Comparative Example 1 | Comparative Example 2 | Comparative Example 3 |
|---|---|---|---|---|---|---|---|
| Compounding/ mass parts | Inorganic fine particle (A) | Inorganic fine particle of No. 1 of Table 1 | 20 | 20 | | | |
| | | Inorganic fine particle of No. 4 of Table 1 | | | 20 | | |
| | | Inorganic fine particle of No. 5 of Table 1 | | | | | |
| | | Inorganic fine particle of No. 6 of Table 1 | | | | | |
| | | Inorganic fine particle of No. 7 of Table 1 | | | | 20 | |
| | | Inorganic fine particle of No. 8 of Table 1 | | | | | 20 |
| | | Inorganic fine particle of No. 9 of Table 1 | | | | | |
| | Polyamide (B) | Polyamide having in its molecular main chain an aliphatic ring | Polyamide 1 | 80 | 80 | 80 | 80 | 80 |
| | (C) Component | Compound having an ethylenic double bond that has one hydroxyl group | Glycerol dimethacrylate | 20 | 20 | 20 | 20 | 20 |
| | | | 2-hydroxypropyl methacrylate | 60 | 60 | 60 | 60 | 60 |
| | (D) Component | Photopolymerization initiating agent | 2,2-dimethoxy-1,1-diphenylethane-1-one | 3 | 3 | 3 | 3 | 3 |
| | Polymerization inhibitor agent | | N-(ammoniumoxy)-N-nitrosphenyl amine | 0.01 | 0.01 | 0.01 | 0.01 | 0.01 |
| | Ultraviolet radiation absorbing agent | | 2,4-di-tert-butyl-6-(5-chloro-2H-1,2,3-benzotriazole-2-yl) phenol | 0.01 | 0.01 | 0.01 | 0.01 | 0.01 |
| | Supporter | | | E2 | E2 | E1 | E1 | E1 |
| | Evaluation results | | Abrasion depth/μm | 9 | 9 | 15 | 5 | 5 |
| | | | Blade ink wiping characteristics | A | A | C | C | C |

The invention claimed is:

1. A photosensitive resin composition characterized by containing comprising:

(A) inorganic fine particles having an average particle diameter that is greater than or equal to 0.5 μm and less than or equal to 4 μm and having a sphericity that is greater than or equal to 0.9, (B) a polyamide having in a molecular main chain an aliphatic ring and/or having a skeleton represented by formula (1) below, (C) a compound having an ethylenic double bond, and (D) a photopolymerization initiating agent

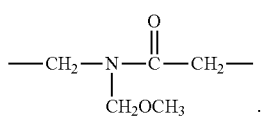

(1)

2. A resin composition for use for an intaglio printing plate precursor or a pad printing plate precursor, which comprises:

(A) inorganic fine particles having an average particle diameter that is greater than or equal to 0.5 μm and less than or equal to 4 μm and having a sphericity that is greater than or equal to 0.9, and (B) a polyamide that has in a molecular main chain an aliphatic ring and/or that has a skeleton represented by formula (1)

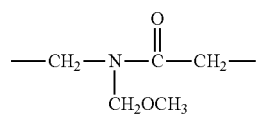

(1)

3. A resin composition for use for an intaglio printing plate precursor or a pad printing plate precursor, which comprises:

(A) inorganic fine particles having an average particle diameter that is greater than or equal to 0.5 μm and less than or equal to 4 μm and having a sphericity that is greater than or equal to 0.9, and (B) a polyamide that has a methylene chain having a carbon number that is 8 or greater.

4. A photosensitive resin composition comprising:

(A) inorganic fine particles having an average particle diameter that is greater than or equal to 0.5 μm and less than or equal to 4 μm and having a sphericity that is greater than or equal to 0.9, (B) a polyamide having a methylene chain that has a carbon number of 8 is 8 or greater, (C) a compound having an ethylenic double bond, and (D) a photopolymerization initiating agent.

5. A photosensitive resin composition according to claim 1, wherein the (B) polyamide has a methylene chain whose that has a carbon number of 8 is 8 or greater.

6. The photosensitive resin composition according to claim 1, wherein the (C) compound having an ethylenic double bond also has an hydroxyl group in the molecule.

7. The photosensitive resin composition according to claim 1, wherein the (B) polyamide has a 4,4'-diaminodicyclohexylmethane adipate skeleton residue.

8. The photosensitive resin composition according to claim 1, wherein the (A) inorganic fine particles have a specific surface area that is less than or equal to 10 m$^2$/g.

9. The photosensitive resin composition according to claim 1, wherein the (A) inorganic fine particles have a maximum particle diameter that is less than or equal to 20 μm.

10. The photosensitive resin composition according to claim 1, wherein the (A) inorganic fine particles are amorphous silica and/or alumina.

11. The photosensitive resin composition according to claim 1, wherein pH of extraction water of the (A) inorganic fine particles has a pH of 5.5 to 8.5.

12. A photosensitive resin printing plate precursor for use in intaglio printing or pad printing, which is made by sequentially stacking an adhesion layer, a photosensitive resin layer made of the photosensitive resin composition according to claim 1, and a protection layer at least on a supporter.

* * * * *